(12) United States Patent
Che et al.

(10) Patent No.: US 7,691,495 B2
(45) Date of Patent: Apr. 6, 2010

(54) ORGANIC LIGHT-EMITTING DEVICES

(75) Inventors: Chi-Ming Che, Hong Kong (CN); Siu-Chung Chan, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 8 days.

(21) Appl. No.: 11/713,755

(22) Filed: Mar. 5, 2007

(65) Prior Publication Data

US 2007/0148495 A1   Jun. 28, 2007

Related U.S. Application Data

(63) Continuation of application No. 10/835,481, filed on Apr. 30, 2004, now abandoned.

(51) Int. Cl.
*H01L 51/54*       (2006.01)
*H05B 33/12*       (2006.01)

(52) U.S. Cl. ................... 428/690; 428/917; 313/504; 313/506; 257/E51.044

(58) Field of Classification Search ................ None
See application file for complete search history.

(56) References Cited

U.S. PATENT DOCUMENTS

| | | | |
|---|---|---|---|
| 3,963,708 A | 6/1976 | L'Eplattenier et al. | |
| 4,008,225 A | 2/1977 | L'Eplattenier et al. | |
| 4,861,904 A | 8/1989 | Sugie | |
| 5,432,014 A | 7/1995 | Sano et al. | |
| 5,755,999 A | 5/1998 | Shi et al. | |
| 5,756,224 A * | 5/1998 | Borner et al. | 428/690 |
| 5,989,738 A * | 11/1999 | Haase et al. | 428/690 |
| 6,048,630 A | 4/2000 | Burrows et al. | |
| 6,310,360 B1 | 10/2001 | Forrest et al. | |
| 6,515,298 B2 | 2/2003 | Forrest et al. | |
| 6,579,633 B2 | 6/2003 | Kim et al. | |
| 6,653,654 B1 * | 11/2003 | Che | 257/40 |
| 6,800,380 B2 | 10/2004 | Kim et al. | |
| 6,991,857 B2 | 1/2006 | Tsuboyama et al. | |
| 7,022,421 B2 * | 4/2006 | Thompson et al. | 428/690 |
| 7,026,480 B2 * | 4/2006 | Che et al. | 546/4 |
| 7,063,901 B2 * | 6/2006 | Igarashi et al. | 428/690 |

(Continued)

FOREIGN PATENT DOCUMENTS

JP    406033050 A    2/1994

(Continued)

OTHER PUBLICATIONS

Chang et al., Luminescent Platinum (II) Complexes Containing Isoquinolinyl Indazolate Ligands: Synthetic Reaction Pathway and Photophysical Properties; Inorganic Chemistry, vol. 46, No. 17; pp. 7064-7074; Jul. 2007.*

(Continued)

*Primary Examiner*—Jill Gray
(74) *Attorney, Agent, or Firm*—Robert D. Katz, Esq.; Cooper & Dunham LLP

(57) ABSTRACT

Disclosed are electrophosphorescent organic metal complexes with formula (I) or (II), of either geometrical isomers, comprising two bidentate NN-type ligandsor a tetradentate NNNN-type ligand, and a transition metal. These electrophosphorescent materials are valuable to the application in organic light-emitting devices (OLEDs), including red-, orange-, or yellow-light OLEDs.

15 Claims, 8 Drawing Sheets

Absorption, excitation and emission spectra of dopant complex 1 in $CH_3CN$

U.S. PATENT DOCUMENTS

| | | | |
|---|---|---|---|
| 7,211,336 B2* | 5/2007 | Igarashi et al. | 428/690 |
| 7,291,405 B2* | 11/2007 | Igarashi et al. | 428/690 |
| 7,303,826 B2* | 12/2007 | Igarashi et al. | 428/690 |
| 7,361,414 B2* | 4/2008 | Tsuboyama et al. | 428/690 |
| 2001/0015432 A1* | 8/2001 | Igarashi | 257/1 |
| 2002/0134984 A1* | 9/2002 | Igarashi | 257/79 |
| 2002/0182441 A1 | 12/2002 | Lamansky et al. | |
| 2002/0197511 A1 | 12/2002 | D'Andrade et al. | |
| 2003/0054198 A1 | 3/2003 | Tsuboyama et al. | |
| 2003/0205707 A1 | 11/2003 | Chi-Ming | |
| 2006/0068222 A1* | 3/2006 | Kitamura et al. | 428/690 |
| 2006/0099450 A1* | 5/2006 | Ogasawara | 428/690 |
| 2006/0099451 A1* | 5/2006 | Igarashi | 428/690 |
| 2006/0141285 A1* | 6/2006 | Ogasawara | 428/690 |
| 2006/0210828 A1 | 9/2006 | Nakayama et al. | |
| 2007/0059551 A1* | 3/2007 | Yamazaki | 428/690 |

FOREIGN PATENT DOCUMENTS

| | | |
|---|---|---|
| JP | 2003/123981 | 4/2003 |
| JP | 2004/256612 A | 9/2004 |
| JP | 2006/140059 A | 6/2006 |
| WO | WO-00/57676 | 9/2000 |
| WO | WO-02/091814 A2 | 11/2002 |
| WO | WO 2004/096755 A1 | 11/2004 |
| WO | WO 2004/096946 A1 | 11/2004 |

OTHER PUBLICATIONS

Che et al., Tetradentate Schiff base platinum(II) complexes as new class of phosphorescent materials for high-efficiency and white-light electroluminescent devices. Chem. Commu., The Royal Society of Chemistry, pp. 1484-1485. 2004.*

Dawson et al. Syntesis and reactivty of sterically hindered iminopyrrolato complexes of zirconium, iron, cobalt and nickel; J.Chem. Soc.., Dalton Trans., pp. 459-466, 2000.*

Di Bella et al., Synthesis, crystal structure and second-order nonlinear opticl properties of [N,N'-bis(1H-pyrrol-2-ylmethylene)- 1,2-benzenediaminato]nickel(II) Schiff base complexes; Inorganica Chimica Acta, pp. 1161-11-67; 2003.*

Kavitha et al., In Search of High-Performance Platinum (II) Phosphorescent Materials for the Fabrication of Red Electroluminescent Devices; Advanced Functional Materials, pp. 223-229, Feb. 2005.*

Xiang et al., High efficiency red electrophosphorescence based on neutral bis(pyrrole)-diimine platinum(ii) complex; Chem Comm., pp. 1408-1410. 2005.*

Yang et al., Self-assemby of 1,4-bis(pyrrol-2-ylmethyleneamine)butane mediated by Ni(II) and weak intermolecular interactions; Journal of Chemical Research, pp. 636-637, Sep. 2004.*

Bacchi et al., Syntheses, characterization and X-ray structure of palladium(II) and nickel(II) complexes of tetradentate pyrrole containing ligands; Inorganic Chimica Acta, pp. 229-235; 2003.*

Adachi, et al., "High-efficiency organic electrophosphorescent devices with tris(2-phenylpyridine)iridium doped into electron-transporting materials," Appl. Phys. Lett., 77(6):904-6 (2000).

Adamovich, et al, "High efficiency single dopant white electrophosphorescent light emitting diodes," New J. Chem., 26:1171-8 (2002).

D'Andrade, et al, "Controlling Exciton Diffusion in Multilayer White Phosphorescent Organic Light Emitting Devices," Adv. Mater., 14(2):147-51 (2002).

Baldo, et al., "Highly efficient phosphorescent emission from organic electroluminescent devices," Nature, 395:151-4 (1998).

Baldo, et al., "Very high-efficiency green organic light-emitting devices based on electrophosphorescence," Appl. Phys. Lett., 75(1):4-6 (1999).

Duggal, et al., "Organic light-emitting devices for illumination quality white light," Appl. Phys. Lett., 80(19):3470-2 (2002).

Ho, et al., "A blue photoluminescent [ZN(L)(CN$_2$)](L =2,2'-dipyridylamine) material with a supramolecular one-dimensional chain structure," Chem. Commun., 2101-2 (1998).

Huang, et al., "High-efficiency white organic light-emitting devices with dual doped structure," App. Phys. Lett., 80(15):2782-4 (2002).

Kawamura, et al., "Energy transfer in polymer electrophosphorescent light-emitting devices with single and multiple doped luminescent layers," J. Appl. Phys.,92(1):87-93 (2002).

Kido, et al., "Multilayer White Light-Emitting Organic Electroluminescent Device," Science, 267:1332-4 (1995).

Ko, et al., "Bright white organic light-emitting diode," Appl. Phys. Lett., 79(25):4234-6 (2001).

Lamansky, et al., "Highly Phosphorescent Bis-Cyclometalated Iridium Complexes: Synthesis, Photophysical Characterization, and Use in Organic Light Emitting Diodes," J. Am. Chem. Soc., 123(18):4304-12 (2001).

Lamansky, et al., "Molecularly doped polymer light emitting diodes utilizing phosphorescent Pt(II) and Ir(III) dopants," Organic Electronics, 2:53-62 (2001).

Lin, et al., "Structural, Photophysical, and Electrophosphorescent Properties of Platinum(II) Complexes Supported by Tetradentate N$_2$O$_2$ Chelates," Chem. Eur. J., 9(6):1264-72 (2003).

Lu, et al., "[(CΛNΛN)Pt(C ≡C)$_n$R][HCΛNΛN =6-aryl-2,2'bipyridine, n = 1-4, R=aryl,SiMe$_3$) as a new class of light-emitting materials and their applications in electrophosphorescent devices," Chem. Commun., 206-7 (2002).

Ma, et al., "A blue electroluminescent molecular device from a tetranucluear zinc(II) compound [7n$_4$O(AID)$_6$] (AID = 7-azaindolate)," Chem. Commun., 2491-2 (1998).

Ma, et al., "Light-emitting diode device from a luminescent organocopper(I) compound," New J. Chem., 263-5 (1999).

Ma, et al., "Triplet luminescent dinuclear-gold(I) complex-based light-emitting diodes with low turn-on voltage," 74(10)1361-3 (1999).

Thompson, et al., "White light emission from blends of blue-emitting organic molecules: A general route to the white organic light-emitting diode?," Appl. Phys. Lett., 79(5):560-2 (2001).

Xie, et al., "Reduction of Self-Quenching Effect in Organic Electrophosphorescence Emitting Devices via the Use of Sterically Hindered Spacers in Phosphorescence Molecules," Adv. Mater., 13(16):1245-8 (2001).

Ardasheva, et al., "Concentration and Aggregationn Effects on Luminescence Properties of Pt(II) Complexes with N,N'-Bis-(salicylidene)-1,3-propanediamine," Russian State Pedagogical University, May 5, 1997.

Vlasov, et al., "New method of determining the activity coefficients of electrolytes from extraction data," Rus. Jour. Phys. Chem., 65(11):1536 (1991).

Tang, C.W., et al.; "Organic electroluminescent diodes"; Appl. Phys. Lett. 51 (12), Sep. 21, 1987 pp. 913-915.

Adachi, Chihaya, et al; "High-efficiency red electrophosphorescence devices"; Appl. Phys. Lett.; 78; 2001; pp. 1622-1624.

Bacchi, Alessia, et al; "Synthesis, characterization and X-ray structure of palladium (II) and nickel (II) complexes of tetradentate pyrrole containing ligands"; Inorganica Chimica Acta; 342; 2003; pp. 229-235.

Adachi, Chihaya, et al.; "Electroluminescence mechanisms in organic light-emitting devices employing a europium chelate doped in a wide energy gap bipolar conducting host"; Amer. Inst. Phys.; 87 (11); 2000; pp. 8049-8055.

* cited by examiner

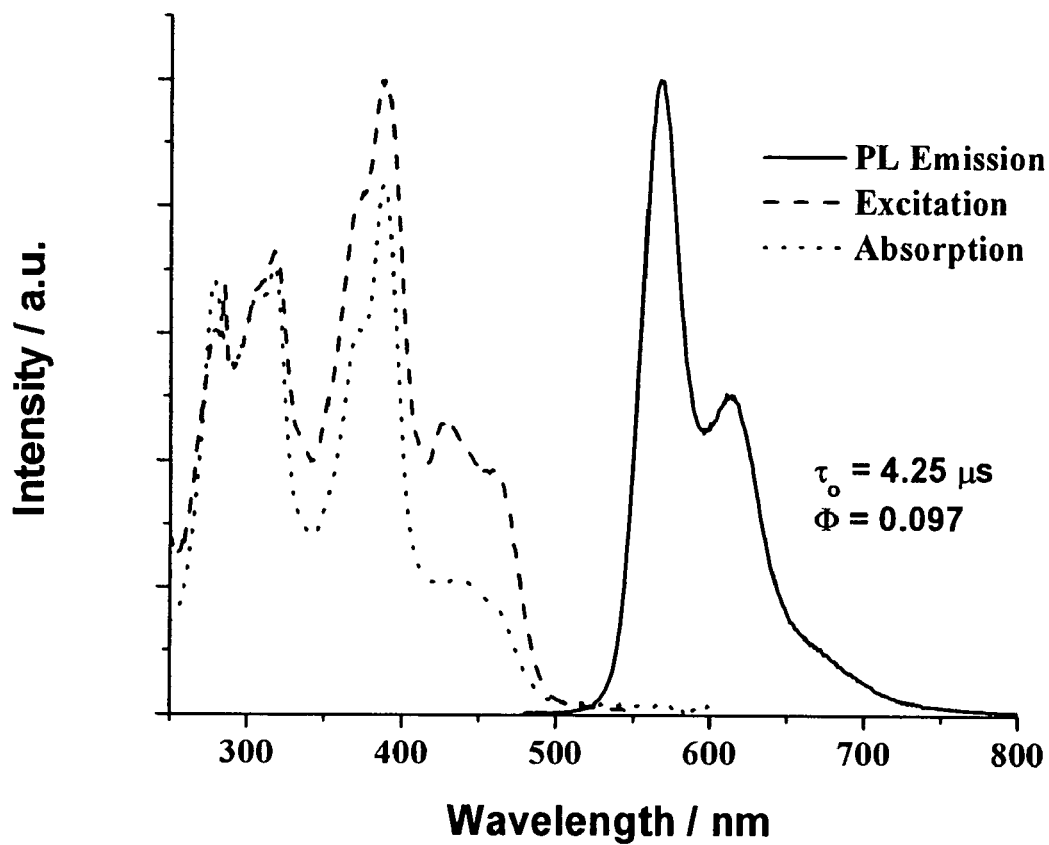
FIG. 1. Absorption, excitation and emission spectra of dopant complex 1 in $CH_3CN$

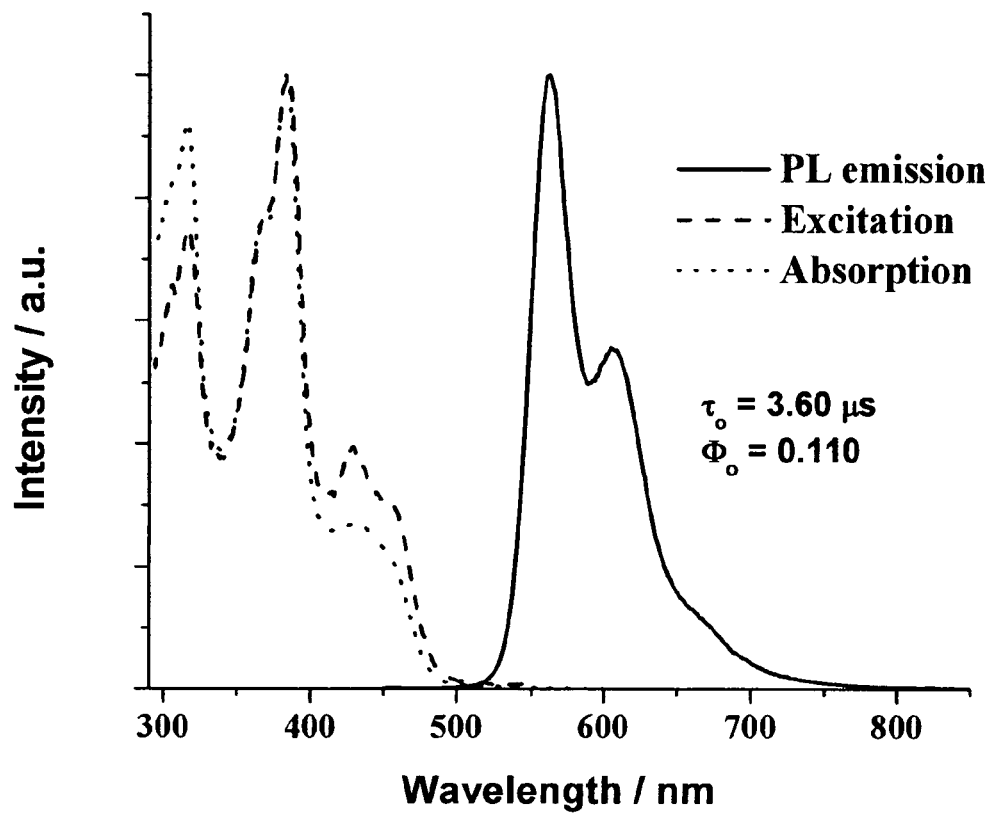
FIG. 2. Absorption, excitation and emission spectra of dopant complex 3 in $CH_3CN$

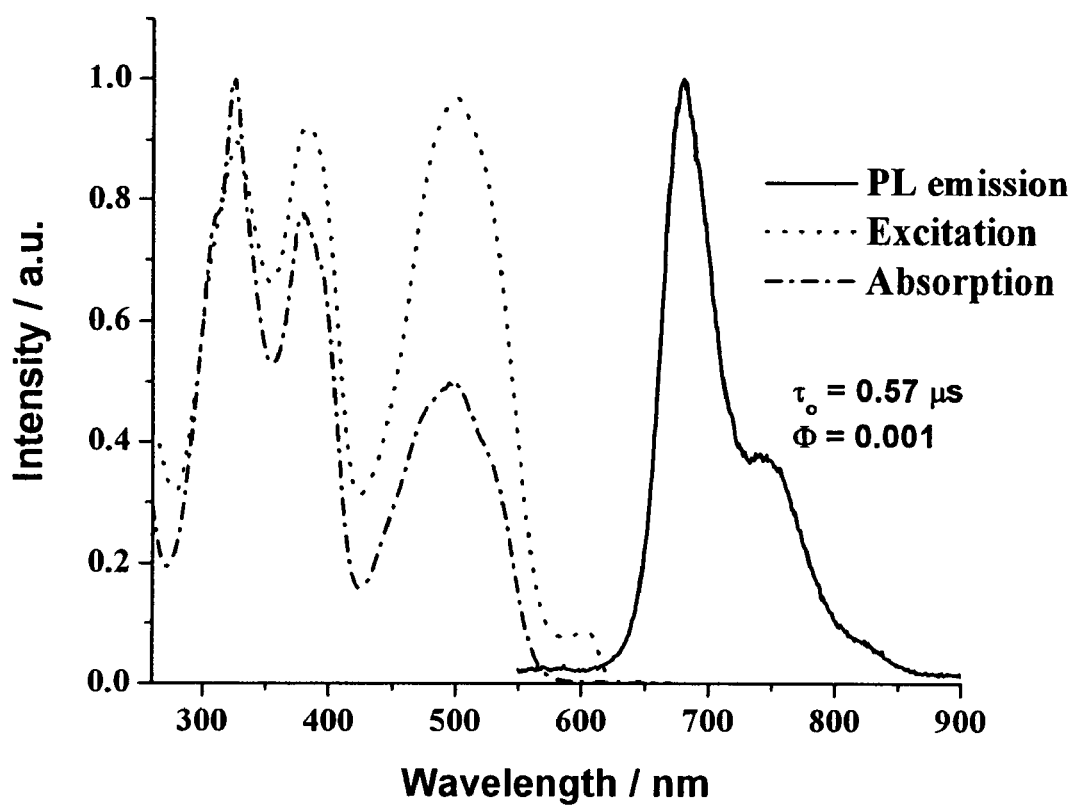
FIG. 3. Absorption, excitation and emission spectra of dopant complex 6 in $CH_3CN$

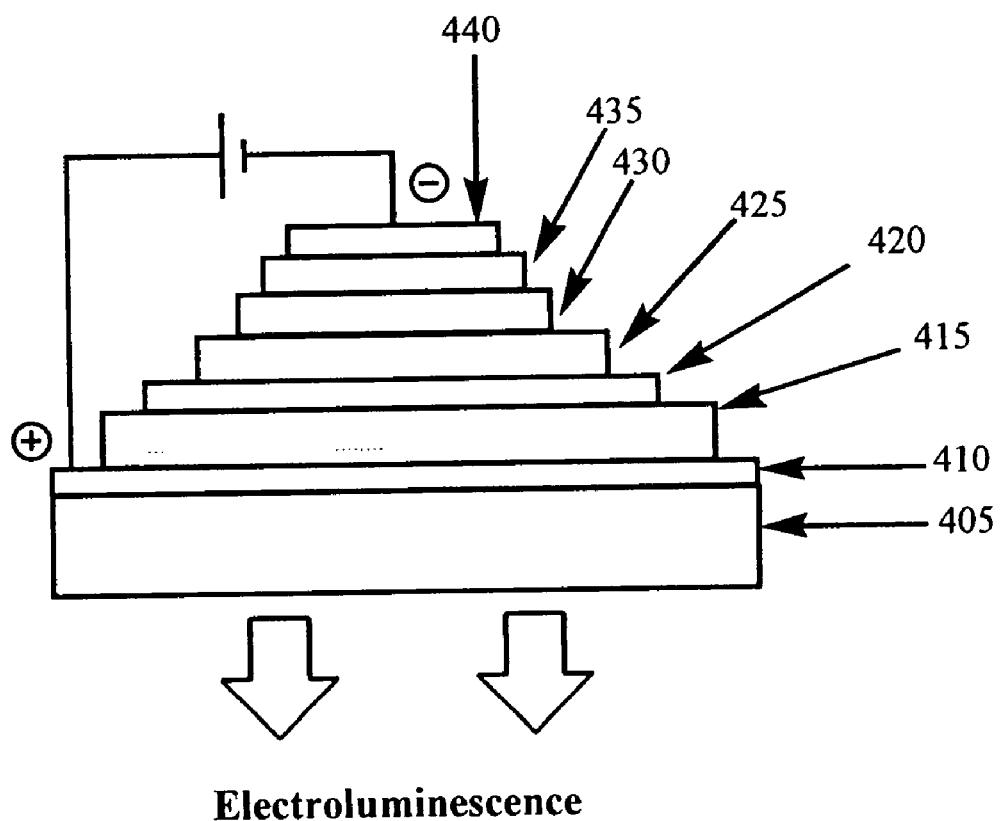
FIG 4. Schematic diagram of OLED in present invention

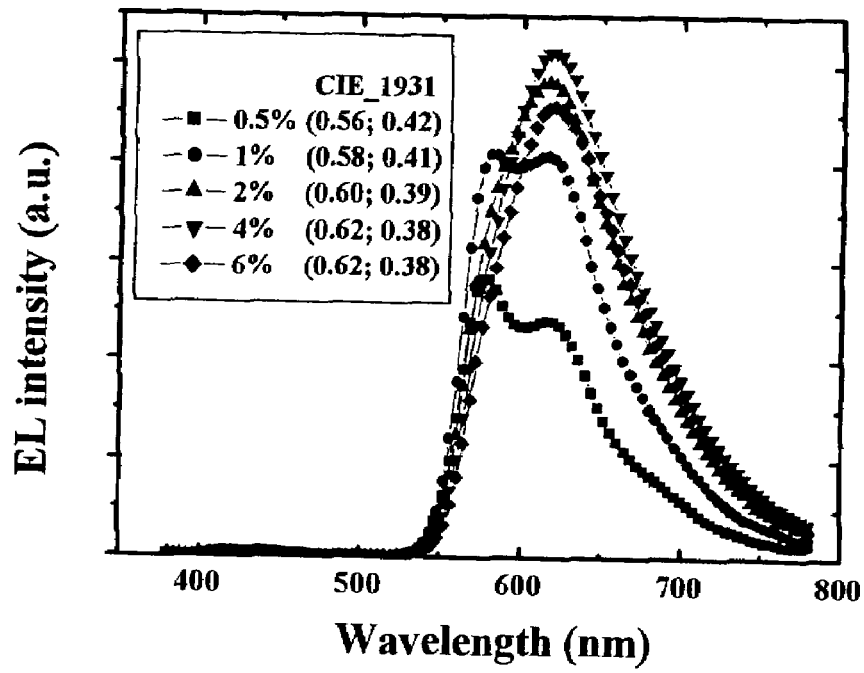
FIG 5. EL spectra of OLED A with 4.0 wt.% dopant 1 at different dopant concentrations under 8 V
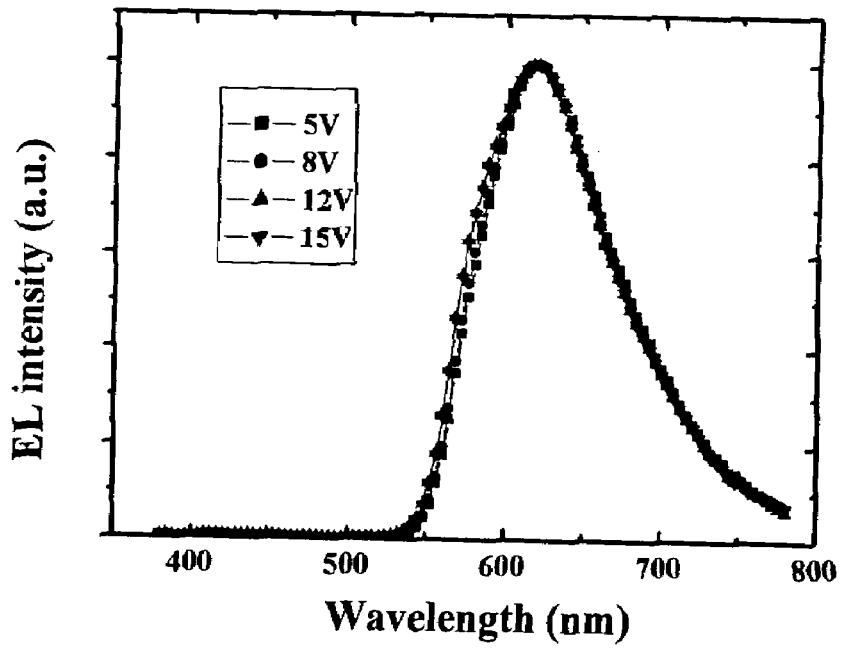
FIG 6. EL spectra of OLED A with 4.0 wt.% dopant 1 at different applied voltages

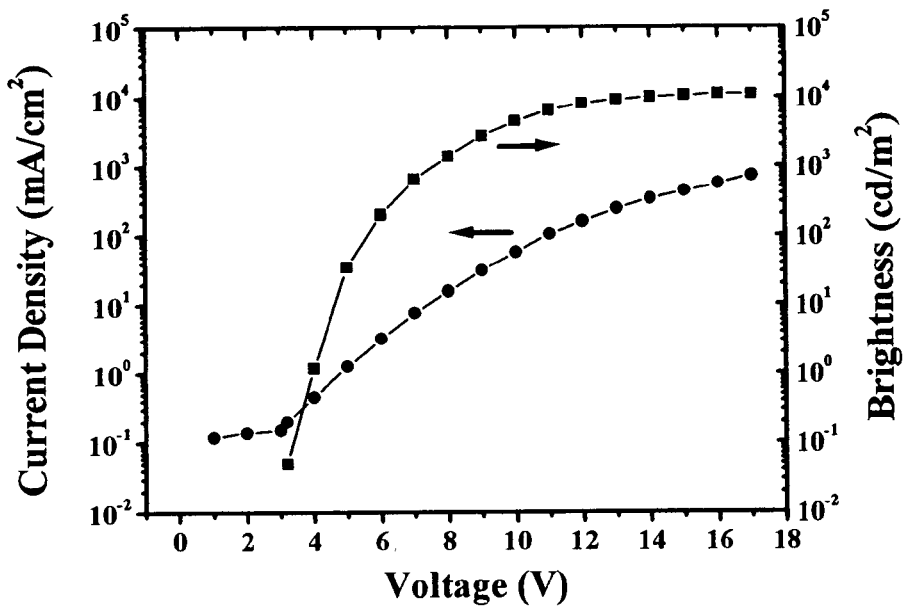
FIG 7. V-I-B curve of OLED A with 4.0 wt.% dopant 1
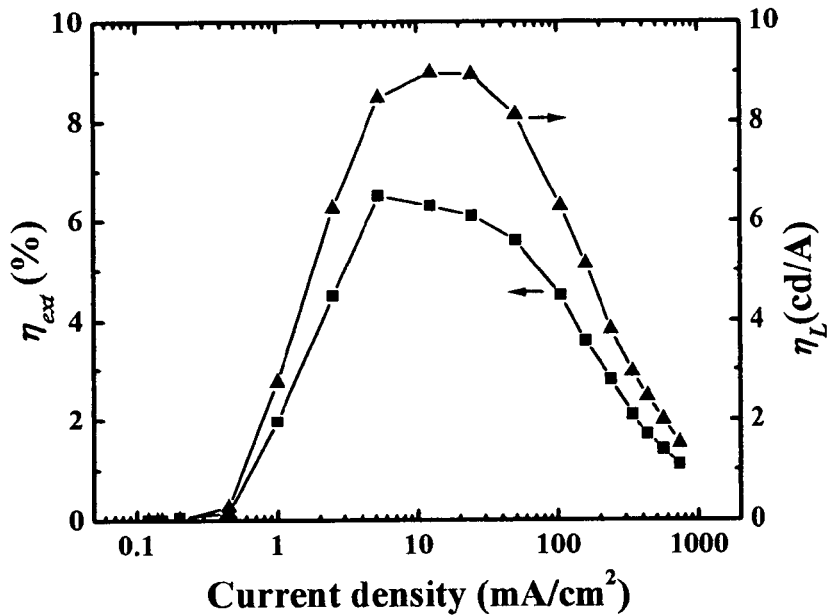
FIG 8. External quantum efficiency and luminous efficiency of OLED A with 4.0 wt.% dopant 1

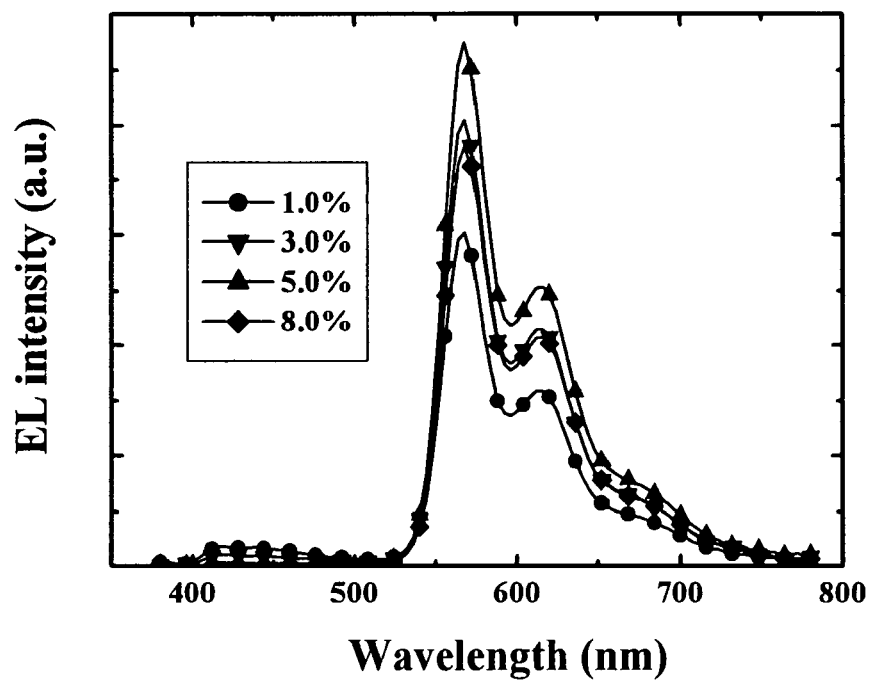
FIG 9. EL spectra of OLED B with 5 wt.% dopant 3 at different dopant concentrations at 8 V
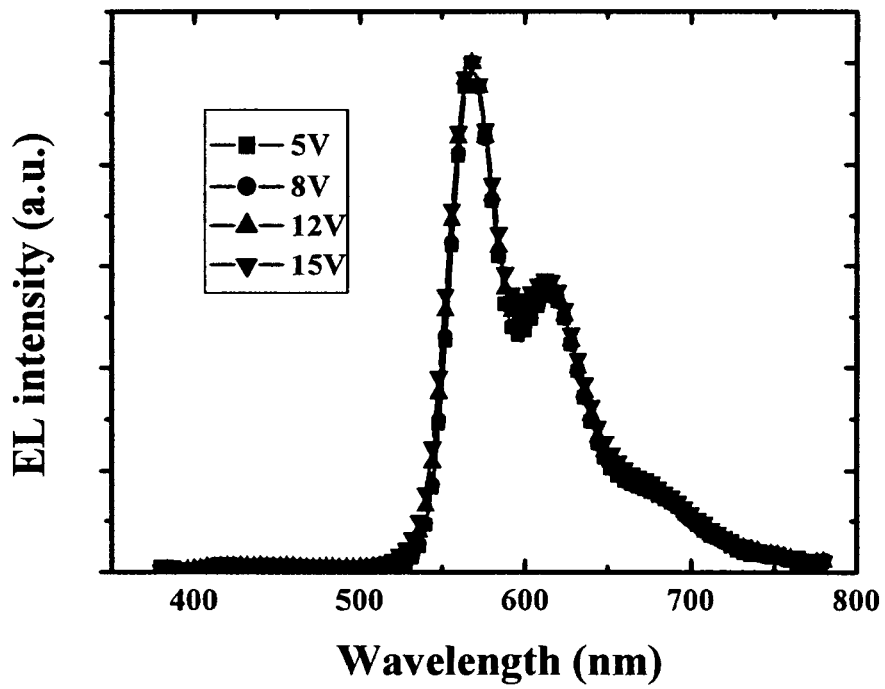
FIG 10. EL spectra of OLED B with 5 wt.% dopant 3 at different applied voltages

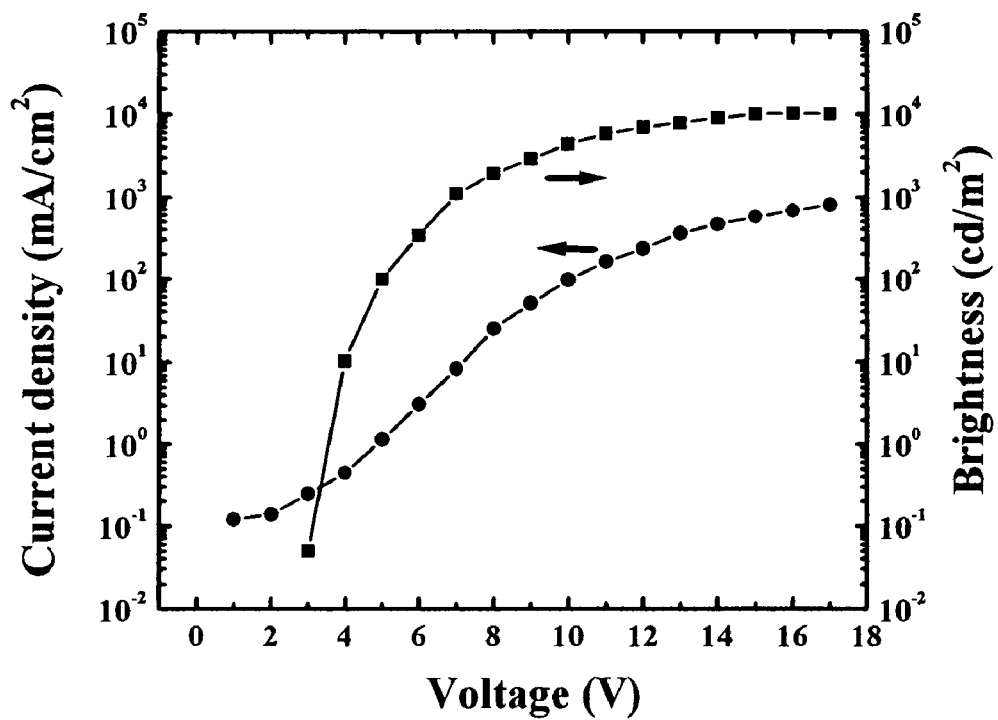
FIG 11. V-I-B curve of OLED B with 5 wt.% dopant 3
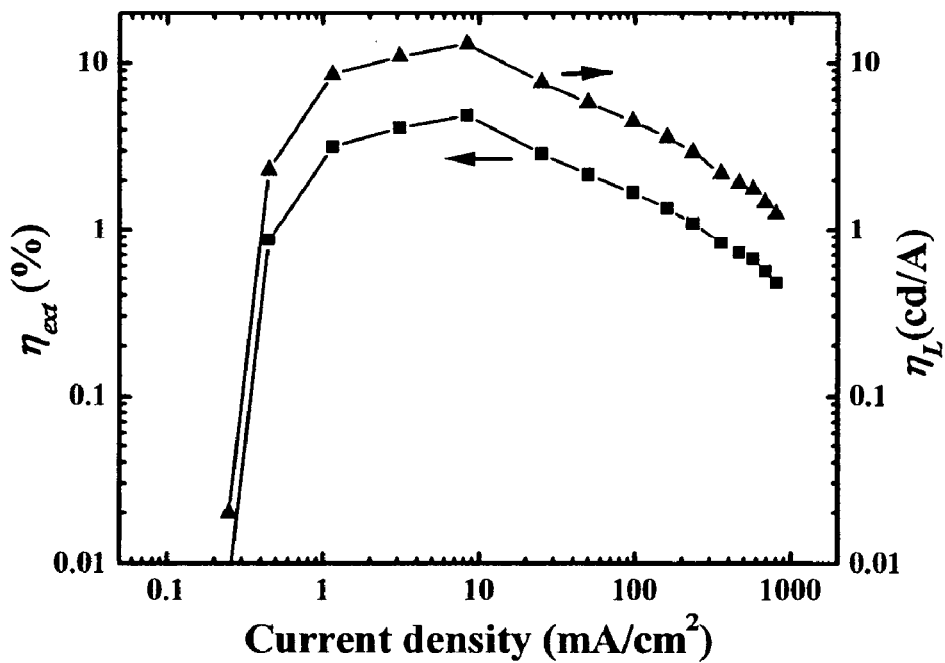
FIG 12. The external quantum efficiency and luminous efficiency of OLED B with 5.0 wt.% dopant 3

ORGANIC LIGHT-EMITTING DEVICES

This is a continuation of application Ser. No. 10/835,481, filed Apr. 30, 2004, now abandoned the disclosure of which is hereby incorporated herein by reference.

FIELD OF THE INVENTION

The present invention relates to efficient organic light-emitting devices (OLEDs) which comprise a transition metal complex, wherein the transition metal complex, of either geometrical isomers, comprises two bidentate NN-type ligands or a tetradentate NNNN-type ligand, and a transition metal atom as the electrophosphorescent emitter. The invention also relates to methods for preparing thin film OLEDs and their applications such as in liquid crystal displays, plasma panel displays and light-emitting diodes.

BACKGROUND OF THE INVENTION

Organic light-emitting devices (OLEDs) are finding applications as next-generation flat-panel displays (FPDs), liquid crystal displays (LCDs), and plasma display panels (PDPs). This has been driven by their favorable properties including lightweight, fast video response and low power consumption. To this end, organometallic compounds exhibiting electroluminescence are particularly attractive for electrophosphorescent applications, since both the ligand structure and the central metal atom can be varied to modify the properties of the device using these compounds.

An organic light-emitting device (OLED) is an energy conversion device which emits light when current is applied. A multilayer OLED is generally comprised of hole and electron injection layers, hole- and electron-transporting layers, an emissive layer, metal oxide layer and metal electrodes. The use of organic small molecules and polymers in the emissive layer has attracted much attention due to their potential applications in full-color large-area flat-panel displays. Tang and VanSlyke first disclosed that organic small molecules can be prepared as thin-films by vacuum deposition to form multilayer organic light-emitting devices (OLEDs) (see Tang et al., *Appl. Phys. Lett.* 51:913, (1987)).

Investigations on organic small molecules have been made in order to improve the performance of OLEDs. In general, fluorescent and phosphorescent materials are employed as light emitters in the emissive layer of OLEDs. Light emission from a fluorescent compound occurs as a result of formation of singlet excitons in the emissive layer of the electroluminescent device. U.S. Pat. No. 6,310,360 disclosed that theoretically 25% singlet excitons and 75% triplet excitons are produced after recombination of holes and electrons in the emissive layer of an electroluminescent device. The singlet excitons transfer their energy to the singlet excited state while the triplet excitons transfer their energy to triplet excited state. Most of the organic small molecules exhibit fluorescence; hence, only 25% of the generated excitons are utilized resulting in the device with low external efficiency.

In contrast to fluorescent compounds, a series of effective phosphorescent iridium complexes with different color emissions has been reported jointly by Thompson et al. at the University of Southern California and Forrest et al. at Princeton University (see U.S. Pat. No. 6,515,298 B2; U.S. Patent Application Publication No.20020182441 A1; Lamansky et al., *J. Am. Chem. Soc.*, 123:4304 (2001); and Xie et al., *Adv. Mat.*, 13:1245 (2001)). Che et al. also demonstrated the use of organic metal complexes employing various metal centres such as platinum(II), copper(I), gold(I), and zinc(II) as OLED emitters (see U.S. Patent Application Publication No. 23205707 A1; U.S. Patent Application Publication No. 22179885 A1; Y.-Y. Lin et al., *Chem. Eur. J.*, 9:1263 (2003); Lu et al., *Chem. Commun.*, 206 (2002); Ma et al., *New J. Chem.*, 263 (1999); Ma et al., *Appl. Phys. Lett.*, 74:1361 (1999); Ho et al., *Chem. Commun.*, 2101 (1998); and Ma et al., *Chem. Commun.*, 2491 (1998)).

A variety of light-emitting compounds, especially red emitters, have been investigated as active emitters in a number of device structures. U.S. Pat. No. 6,048,630 disclosed OLEDs based on phosphorescent Pt(OEP) complex ($H_2$OEP=octylethylporphyrin) which emits saturated red electroluminescence. Thompson and Forrest et al. reported a red phosphorescent material (bis(2-(2'-benzo[4,5-a]thienyl)pyridinato-N, $C^3$)iridium(acetylacetonate) [Btp2Ir(acac)]) with high-efficiency ($\eta_{ext}$=7.0±0.5%) (see Adachi et al., *Appl. Phys. Lett.*, 78:1622 (2001)). In addition, europium complex employed as red emissive dopant in OLED ($Eu(TTA)_3$phen, TTA=thenoyltrifluoroacetone; phen=1,10-phenanthroline) was also reported to show sharp red electroluminescence (see Adachi et al., *J. Appl. Phys.*, 87:8049, (2000)).

Efforts in the development of red phosphorescent emitters with high efficiency for OLEDs are geared towards the full-color flat panel display application. Even though remarkable progress has been made, challenges such as optimization of stability and efficiency of OLEDs need to be met before commercialization. It is, therefore, particularly contemplated to develop phosphorescent materials, which exhibit electroluminescent (EL) emissions in visible light region, with high efficiencies and good stabilities.

SUMMARY OF THE INVENTION

The main objective of this invention is to provide organic light-emitting devices (OLEDs) comprising an emissive layer, which employs at least one dopant complex as an electrophosphorescent emitter. The devices should exhibit low turn-on voltages, high luminance, high efficiencies, and desirable colors.

Another objective of the present invention is to provide an OLED structure, which employs an emissive layer comprising at least one electrophosphorescent dopant complex and at least one host material.

In one embodiment, the invention relates to a heterostructured organic light-emitting device comprising:

a substrate upon which a first electrode is placed;

a hole-transporting layer;

at least one emissive layer comprising at least one host material and at least one dopant complex; the dopant complex, of either geometrical isomers, comprising at least one transition metal coordinated to two bidentate NN-type ligands, or a tetradentate NNNN-type ligand;

a hole-blocking layer;

an electron-transporting layer;

a charge injection layer; and a second electrode sandwiching the hole-transporting layer, emissive layer, hole-blocking layer, electron-transporting layer and charge injection layer between the first and the second electrode.

In preferred embodiments, the invention relates to OLED comprising an emissive layer which contains at least one transition metal complex. The transition metal complexes, of either geometrical isomers, contain two bidentate NN-type ligand, or a tetradentate NNNN-type ligand, and a transition metal as the electrophosphorescent dopant complexes.

In a preferred embodiment, the invention relates to a heterostructured OLED comprising one or more dopant complexes of following formulae:

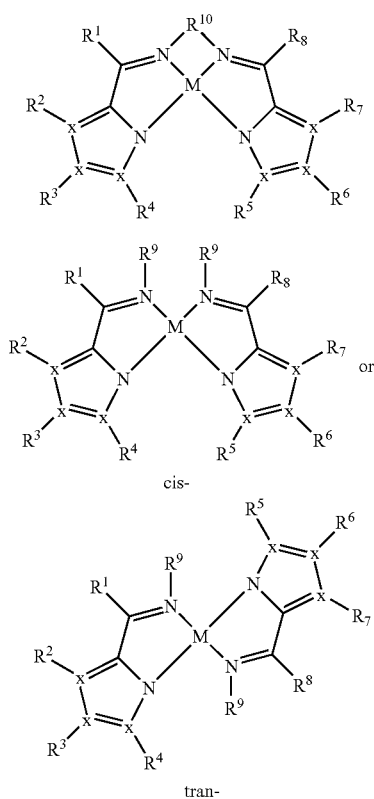

or mixtures thereof, wherein

M is a transition metal selected from the group consisting of Ni, Pd and Pt;

each $R^1$-$R^8$ is independently —H, —OH, —$NH_2$, -halogen, —CN, —$NO_2$, —$R^{11}$, —$OR^{12}$, —$NHR^{13}$, or —$N(R^{13})_2$;

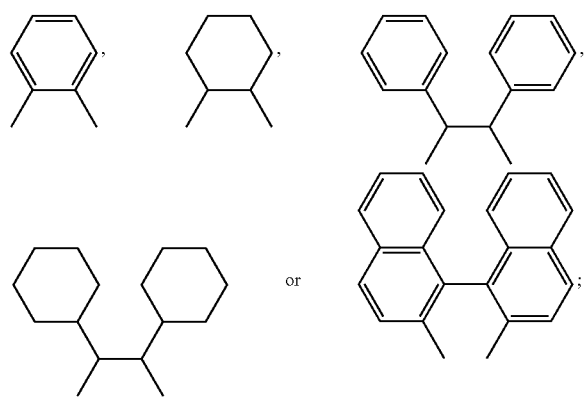

each $R^9$ is independently —H, —($C_1$-$C_6$)alkyl, -phenyl, -naphthyl; -halogen, or —CN;

$R^{11}$ is —($C_1$-$C_6$)alkyl, -phenyl, or -naphthyl, each of which is unsubstituted or substituted with one or more —($C_1$-$C_6$) alkyl, -phenyl, or -naphthyl;

$R^{12}$ is defined as above for $R^{11}$;

$R^{13}$ is defined as above for $R^1$;

x is independently a carbon or nitrogen atom; and n is an integer number from 1 to 6.

Another embodiment, the present invention relates to a method of preparing heterostructured organic light emitting devices with yellow, orange or red color emissions. The method includes the steps of:

providing a substrate upon which a first electrode is placed;

providing a hole-transporting layer on top of the first electrode;

forming an emissive layer on top of the hole-transporting layer, the emissive layer comprising at least one host material and at least one dopant complex, the dopant complex, of either geometrical isomers, comprising a transition metal coordinated to two bidentate NN-type ligands or a tetradentate NNNN-type ligand.

providing a hole-blocking layer on top of the emissive layer;

providing an electron-transporting layer on top of the hole-blocking layer;

providing a charge injection layer on top of the electron-transporting layer; and providing a second electrode on top of the charge injection layer.

In a preferred embodiments of the present invention includes, but is not limited to, OLEDs comprising heterostructures for producing red, orange or yellow electroluminescence; the devices contain an anode (ITO glass substance), a hole-transporting layer (N,N'-diphenyl-N,N'-bis(2-naphthalene)benzidine (β-NPB)), an emissive layer comprising a host material (4,4'-bis(carbazol-9-yl)biphenyl (CBP)) and an electrophosphorescent dopant complex as illustrated in Formulae I, or II, herein), a hole-blocking layer (2,9-dimethyl-4,7-diphenyl-1,10-phenanthroline (BCP)), an electron-transporting layer (tris(8-hydroxyquinolato) aluminum ($Alq_3$)), a charge injection layer (lithium fluoride) and a cathode (aluminum metal).

More preferably, the OLEDs employing electrophosphorescent dopant complexes as illustrated in Formulae I, or II, herein demonstrate red, orange or yellow emission while a current is applied.

In according with the present invention, the high efficiency OLEDs can be applied to the field of electronic flat panel display, display board for sign lamp or light source.

BRIEF DESCRIPTION OF THE DRAWINGS

FIG. 1. Absorption, excitation and emission spectra of dopant complex 1 in $CH_3CN$ FIG. 2. Absorption, excitation and emission spectra of dopant complex 2 in $CH_3CN$ FIG. 3. Absorption, excitation and emission spectra of dopant complex 4 in $CH_3CN$ FIG. 4. Schematic diagram of OLED in present invention FIG. 5. EL spectra of OLED A with 4.0 wt. % dopant 1 at different dopant concentrations under 8 V FIG. 6. EL spectra of OLED A with 4.0 wt. % dopant 1 at different applied voltages FIG. 7. V-I-B curve of OLED A with 4.0 wt. % dopant 1

FIG. 8. External quantum efficiency and luminous efficiency of OLED A with 4.0 wt % dopant 1

FIG. 9. EL spectra of OLED B with 5 wt. % dopant 2 at different dopant concentrations at 8 V FIG. 10. EL spectra of OLED B with 5 wt. % dopant 2 at different applied voltages FIG. 11. V-I-B curve of OLED B with 5 wt. % dopant 2

FIG. 12. The external quantum efficiency and luminous efficiency of OLED B with 5.0 wt. % dopant 2

DETAILED DESCRIPTION OF THE INVENTION

Some definitions useful for describing the present invention are provided below:

As used herein, the phrase "bidentate NN-type ligands" refers to a molecule containing an imine group and either a pyrrol group, a pyrazol group, an imidazol group, or a triazol group, which ligand is coordinated to a metal through the nitrogen atoms of these groups.

As used herein, the phrase "tetradentate NNNN-type ligand" refers to a molecule containing a two imine groups and either two pyrrol groups, two pyrazol groups, two imidazol groups, or two triazol groups, which ligand is coordinated to a metal through the nitrogen atoms of these groups.

As used herein, the phrase "light-emitting device" refers to structures presenting an assymetric impedance to current. Typically, such a device allows current to flow more easily in one direction when it is said to be forward biased. However, in some devices of the present invention, significant current may flow in the reverse biased state as well with generation of light.

The present invention is related to a heterostructured OLED comprising an emissive layer, wherein the emissive layer comprises at least one host material and at least one emissive material. Preferably, the emissive material is a dopant complex, of either geometrical isomers, comprising a transition metal coordinated to two bidentate NN-type ligandsor a tetradentate NNNN-type ligand. The dopant complex can be present as a monomer, a dimer, an oligomer, or mixtures thereof.

In one embodiment, the invention relates to a heterostructured organic light-emitting device comprising:
a substrate upon which a first electrode is placed;
a hole-transporting layer;
at least one an emissive layer comprising at least one host material and at least one dopant complex; the dopant complex, of either geometrical isomers, comprising at least one transition metal coordinated to two bidentate NN-type ligands two bidentate NO-type ligands or a tetradentate NNNN-type ligand;
a hole-blocking layer;
an electron-transporting layer;
a charge injection layer; and
a second electrode sandwiching the hole-transporting layer, emissive layer, hole-blocking layer, electron-transporting layer and charge injection layer between the first and the second electrode.

Preferably, the emissive materials are dopant complexes, of either geometrical isomers, comprising two bidentate NN-type ligands or two bidentate NO-type ligands or a tetradentate NNNN-type ligand or a tetradentate NOON-type ligand and a transition metal atom. More preferably, the emissive materials include dopant complexes of the following formulae:

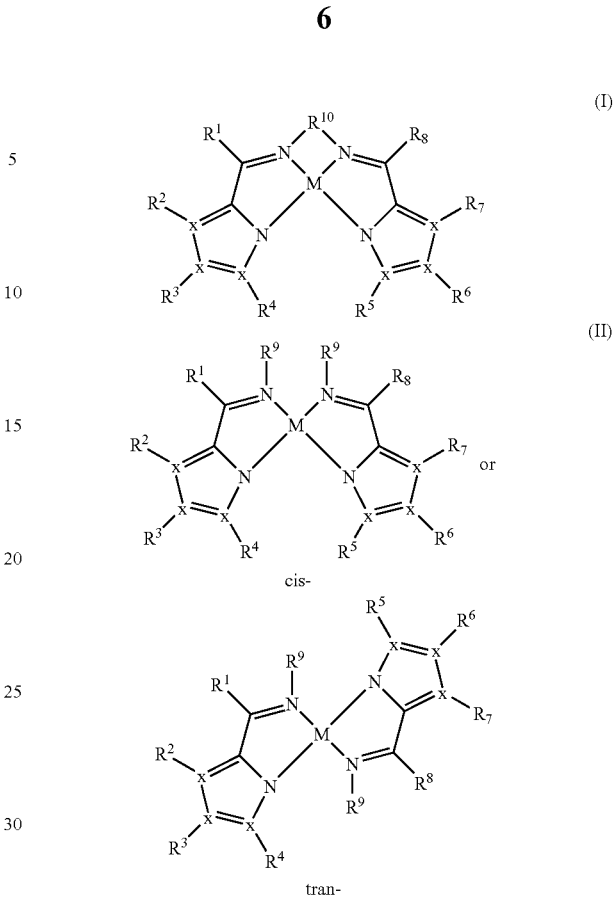

or mixtures thereof, wherein

M is a transition metal selected from the group consisting of Ni, Pd and Pt;

each $R^1$-$R^9$ is independently —H, —OH, —NH$_2$, -halogen, —CN, —NO$_2$, —$R^{11}$, —$OR^{12}$, $NHR^{12}$, or —$N(R^{12})_2$;

$R^{10}$ is —$(C(R^{13})_2)_n$—,

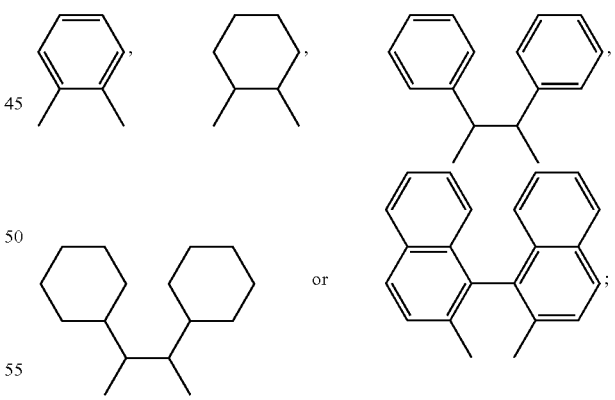

each $R^9$ [[—R $^{10}$]]is —H, —(C$_1$-C$_6$)alkyl, -phenyl, -naphthyl; -halogen, or —CN;

$R^{11}$ is —(C$_1$-C$_6$)alkyl, -phenyl, or -naphthyl, each of which is unsubstituted or substituted with one or more —(C$_1$-C$_6$) alkyl, -phenyl, or -naphthyl;

$R^{12}$ is defined as above for $R^{11}$; and $R^{13}$ is defined as above for $R^1$;

x is independently carbon or nitrogen atom; and n is an integer from 1 to 6.

In some embodiments, the compounds of formulae (I), or (II) may comprise $R^1$-$R^8$ groups that are electron donors. Non-limiting examples of electron donor groups are amines including —$N(R^{12})_2$ and —$OR^{12}$.

In some embodiments, the compounds of formulae (I), or (II) may comprise $R^1$-$R^8$ groups that are electron acceptors. Non-limiting examples of electron acceptor groups include —F, —Cl, —Br, —I, —$NO_2$, —$C(O)(C_1$-$C_6)$, —$C(O)O(C_1$-$C_6)$, —SCN, —$SO_3F$ and —CN.

Some illustrative examples and exemplary compounds of formulae (I) and (II) are listed below in Table 1:

TABLE 1

| Structure | Dopant Complex |
|---|---|
| 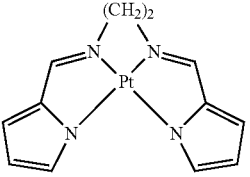 | 1 |
| 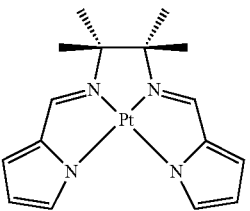 | 2 |
| 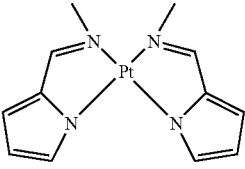 | 3 |
| 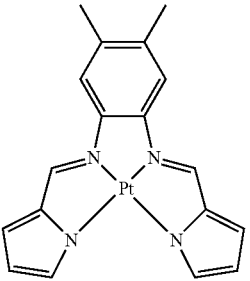 | 4 |
| 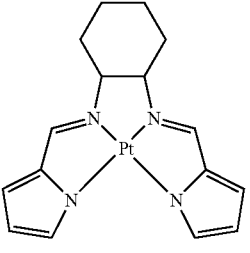 | 5 |

TABLE 1-continued

| Structure | Dopant Complex |
|---|---|
| 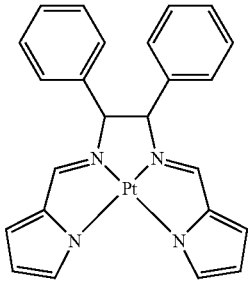 | 6 |
| 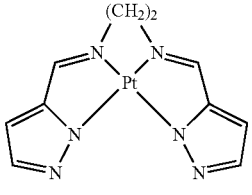 | 8 |
| 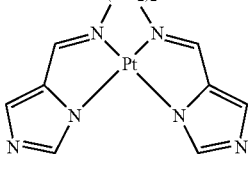 | 9 |
| 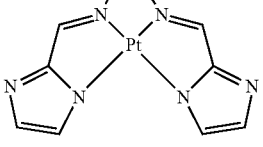 | 10 |
| 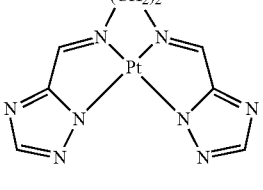 | 11 |
| 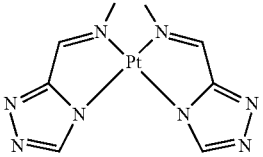 | 12 |
| 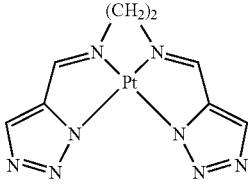 | 13 |

TABLE 1-continued

| Structure | Dopant Complex |
|---|---|
| | 14 |
| | 15 |
| | 16 |
| | 17 |
| | 18 |

Non-limiting examples of bidentate NN-type ligands include those shown above for dopant complexes 3 and 14 to 18. For example, NN-type ligands are selected from ligands consisting of at least an unsubstituted 5-membered or 6-membered ring or substituted 5-membered; wherein the substituted 5-membered ring includes at least one substituent selected from the groups; a hydrogen, a halogen, a hydroxyl group, an alkyl group, a cycloalkyl group, an aryl group, an acyl group, an alkoxy, an acyloxy group, an amino group, an acyl amino group, an aralkyl group, a cyano group, a carboxyl group, a thio group, a vinyl group, a styryl group, an aminocarbonyl group, a carbonyl group, an aranyl group, an aryloxycarbonyl group, a xylyloxycarbonyl group, a phenoxycarbonyl group or an alkoxycarbonyl group as well as recognized donor or acceptor groups; wherein the substituents, for example, an aryl group, may combine together to form a substituted or unsubstituted, saturated or unsaturated ring with any number of members. In a preferred embodiment, the transition metal is Pt.

Non-limiting examples NNNN-type ligands include those shown above for dopant complexes 1-2 and 4-13. For example, NNNN-type ligands are selected from ligands consisting of at least an unsubstituted 5-membered or substituted 5-membered; wherein those substituted 5-membered or 6-membered ring includes at least a substituent selected from the groups; a hydrogen, a halogen, a hydroxyl group, an alkyl group, a cycloalkyl group, an aryl group, an acyl group, an alkoxy, an acyloxy group, an amino group, an acyl amino group, an aralkyl group, a cyano group, a carboxyl group, a thio group, a vinyl group, a styryl group, an aminocarbonyl group, a carbonyl group, an aranyl group, an aryloxycarbonyl group, a xylyloxycarbonyl group, a phenoxycarbonyl group or an alkoxycarbonyl group as well as recognized donor or acceptor groups; wherein the substituents, for example, an aryl group, may combine together to form a substituted or unsubstituted, saturated or unsaturated ring with any number of members. In a preferred embodiment, the transition metal is Pt.

The present invention is also directed to methods for preparation of OLEDs that can be fabricated by a vapor deposition process.

In one embodiment, OLEDs contain an anode, a hole-transporting layer, an emissive layer comprising at least one host material and at least one dopant complex, a hole-blocking layer, an electron-transporting layer, a charge injection layer and a cathode.

Non-limiting examples of an anode useful for OLEDs are indium-tin-oxide (ITO) and doped polyaniline.

Non-limiting examples of hole-transporting materials useful in the present invention are beryllium bis(2-(2'-hydroxyphenyl)pyridine, 4,4'-bis(carbazol-9-yl)biphenyl (CBP), N,N'-diphenyl-N,N'-bis(1-naphthalene)benzidine (α-NPB), N,N'-diphenyl -N,N'-bis(2-naphthalene)benzidine (β-NPB), N,N'-bis(3-methylphenyl)-N,N'-bis(phenyl)benzidine (TPD), 4,4',4"-tris(N-3-methylphenyl-N,N'-phenylamino) triphenylamine (m-TDATA) and tetrakis(diarylamino)-9,9'-spirobifluorenes.

Non-limiting examples of host materials useful in the present invention include beryllium bis(2-(2'-hydroxyphenyl)pyridine, 4,4'-bis(carbazol-9-yl)biphenyl (CBP), N,N'-diphenyl-N,N'-bis(1-naphthalene)benzidine (α-NPB), N,N'-diphenyl-N,N'-bis(2-naphthalene)benzidine (β-NPB), N,N'-bis(3-methylphenyl)-N,N'-bis(phenyl)benzidine (TPD), 4,4', 4"-tris(N-3-methylphenyl-N-phenylamino)triphenylamine (m-TDATA) tetrakis(diarylamino)-9,9'-spirobifluorenes, beryllium bis(2-(2'-hydroxyphenyl)pyridine (Bepp$_2$), 3-phenyl-4-(1'-naphthyl)-5-phenyl-1,2,4-triazole (TAZ); 2,9-dimethyl-4,7-diphenyl-1,10-phenanthroline (BCP), 1,3-bis(N, N-t-butyl-phenyl)-1,3,4-oxadiazole (OXD7), and 1,3,5-tris (3-methyldiphenylamino)benzene (m-MTDAB).

In this invention, at least one suitable host material was employed in an emissive layer together with at least one dopant complex.

Non-limiting examples of dopant complexes, of either geometrical isomers, comprising a transition metal coordinated to two bidentate NN-type ligands or a tetradentate NNNN-type ligand include those shown for dopant complexes 1-18 in Table 1 above. In a preferred embodiment, the dopant complexes are selected from the groups consisting of dopant complexes 1-18 and mixtures thereof. More preferably, the dopant complexes are 1, 2, 4, and 19.

Non-limiting examples of hole-blocking layer suitable for the present invention include 3,4,5-triphenyl-1,2,4-triazole, 3-(biphenyl-4-yl)-4-phenyl-5-(4-tert-butylphenyl)-1,2,4-triazole (TAZ), 2,9-dimethyl-4,7-diphenyl-1,10-phenanthroline (BCP) and 1,3.5-tris[5-(4-(1,1-dimethylethyl)phenyl)-1, 3,4-oxadiazol-2-yl]benzene (TBOP).

Non-limiting examples of electron-transporting materials for the present invention include tris(8-hydroxyquinolato) aluminum (Alq$_3$) and 2-(4-biphenylyl)-5-(p-tert-butylphenyl)-1,3,4-oxadiazole.

Non-limiting examples of charge injection layer suitable for the present invention include lithium fluoride, cesium fluoride and lithium benzoate.

Non-limiting examples of low work function metals for use as cathode in the present invention include aluminum, potassium, lithium, magnesium, silver, gold, rubidium, beryllium and cesium.

In one preferred embodiment, the, OLED described herein comprises heterostructures for producing electroluminescence which contain an anode (ITO glass substance), a hole-transporting layer (N,N'-diphenyl-N,N'-bis(2-naphthalene) benzidine (β-NPB)), a matrix emissive layer including a host material 4,4'-bis(carbazol-9-yl)biphenyl (CBP)) and an electrophosphorescent dopant complex as illustrated in Formulae I, or II herein, a hole-blocking layer (2,9-dimethyl-4,7-diphenyl-1,10-phenanthroline (BCP)), an electron-transporting layer (tris(8-hydroxyquinolato) aluminum ($Alq_3$)), a charge injection layer (lithium fluoride) and a cathode (aluminum metal).

Preferably, in present invention, OLEDs comprising dopant complexes as illustrated in Formula I, or II herein exhibit red, orange or yellow electroluminescence. The concentration of the dopant complexes in the emissive layer can range from 0.5 to 8.0 wt. % based on the efficiency of energy conversion between dopant complexes and host materials and molecular structure of dopant complexes. However, other concentrations can be used.

The following examples are set forth to aid in understanding of the inventions but are not intended to, and should not be interpreted to, limit in any way the claimed invention.

EXAMPLE 1

Example 1 shows the synthesis of dopant complex 1. The tetradentate NNNN-type ligand was prepared according to modification of literature procedures (see Bacchi et al., *InorganicaChimica Acta*. 342:229, (2003); Male et al., *J. Chem. Soc., Dalton Trans.* 2487, (1997)).

Synthesis of Dopant Complex 1

Sodium acetate (0.077 g, 0.94 mmol) was suspended in a DMF (10 mL) solution of bidentate ligand, N,N-Bis-(1H-pyrrol-2-ylmethylene)-ethane-1,2-diamine (0.1 g, 0.47 mmol). $K_2PtCl_4$ (0.19 g, 0.47 mmol) dissolved in DMSO (1 mL) was dropwise added to the suspension at 80° C. dropwise. The resulting yellow solution turned orange-red after being stirred at 80° C. for 4 hours. After cooling, distilled water (50 mL) was then added to the orange-red mixture to afford an orange-brown precipitate. The solid product was filtered and washed with $H_2O$ (2×10 mL) to give an orange-brown solid, which was then purified by silica gel column chromatography with $CH_2Cl_2$ as the eluent. Removal of solvent gave an orange solid. Orange red crystals were obtained by slow evaporation of acetonitrile solution of the orange solid. Yield: 42 mg (22%). $^1H$ NMR ($CDCl_3$): δ=7.67 (s, 2H, HC=N), 7.10 (m, 2H, pyrrole), 6.71 (d, J=3.3 Hz, 2H, pyrrole), 6.29 (dd, J=3.9, 1.8 Hz, 2H, pyrrole), 4.18 (s, 4H, $CH_2$). $^{13}C$ NMR ($CDCl_3$): δ=155.7, 145.4, 137.7, 119.0, 110.7, 59.4. FAB-MS (m-NBA) (m/z): 407 {$M^+$}. IR (KBr): ν=3107, 3095, 3028, 2998, 2913, 1582, 1570 $cm^{-1}$. Anal. Calcd (%) for $C_{12}H_{12}N_4Pt$: C, 35.38; H, 2.97; N, 13.75. Found: C, 34.89; H, 2.98; N, 13.29.

EXAMPLE 2

Example 2 shows the photophysical properties of non-limiting illustrative emissive materials corresponding to dopant complexes 1, 2 and 4 of the present invention. The absorption and photoluminescence properties of dopant complexes are provided in Table 2. UV/vis absorption, excitation and emission spectra of dopant complexes 1, 2 and 4 are shown in FIG. 1 to 3 respectively. The photoluminescence (PL) spectrum is substantially independent of excitation wavelength from 300 to 450 nm. At room temperature, strong PL emissions are obtained with quantum yields (φ) up to 0.110 in $CH_3CN$. The emission lifetimes of the dopant complexes range from 0.57 to 4.25 μs.

TABLE 3

Physical characterization of dopant complexes 1, 2 and 4.

| Dopant Complex | $\lambda_{abs,sol.}$ (nm) [ε ($10^{-4} dm^3 mol^{-1} cm^{-1}$)]$^a$ | $\lambda_{em,sol.}{}^a$ (nm) | τ (μs)$^b$ [Φ$_{em,sol.}$] |
|---|---|---|---|
| 1 | 278 [1.52], 307 [1.47], 317 [1.56], 372 [sh, 1.34], 388 [1.85], 438 [0.45], 459 [sh, 0.36] | 566 (max), 613 | 4.25 [0.097] |
| 2 | 279 [1.45], 316 [1.64], 367 [1.36], 383 [1.82], 431 [0.48], 448 [sh, 0.41] | 563 (max), 606, 656 | 3.60 [0.110] |
| 4 | 246 [1.19], 310 [sh, 1.94], 324 [2.57], 379 [1.99], 390 [sh, 1.80], 478 [sh, 1.20], 498 [1.30], 520 [sh, 1.06] | 680 (max), 740, 822 | 0.57 [0.001] |

$^a$UV/vis and PL emission was measured in acetonitrile ($CH_3CN$)
$^b$Lifetime was measured at peak maximum FIG. 1 shows representative UV/vis absorption, excitation and emission spectra of dopant complex 1 in $CH_3CN$ solution. The solution exhibits strong absorption bands ranged from 278 to 388 nm (ε=1.52 to $1.85 \times 10^{-4} dm^3 mol^{-1} cm^{-1}$) and moderately intense absorption bands from 438 to 459 nm (ε=0.45 to $0.36 \times 10^{-4} dm^3 mol^{-1} cm^{-1}$). Upon excitation at 459 nm, an orange photoluminescence (PL) emission is obtained with $\lambda_{max}$ 566 nm and 613 nm. PL quantum yield (Φ) of complex 1 is 0.097.

FIG. 2 depicts the UV/vis, excitation and emission spectra of dopant complex 2 in $CH_3CN$ solution. The solution exhibits several vibronic absorption transitions ranged from 279 to 383 nm (ε=1.45 to $1.82 \times 10^{-4} dm^3 mol^{-1} cm^{-1}$) and moderately intense absorption bands from 431 to 448 nm (ε=0.48 to $0.41 \times 10^{-4} dm^3 mol^{-1} cm^{-1}$). The dopant complex 2 exhibits an orange PL emission bands at $\lambda_{max}$ 563 nm and 656 nm while the excitation wavelength is at 431 nm. PL quantum yield (Φ) of complex 2 is 0.110.

FIG. 3 shows the UV/vis absorption, excitation and emission spectra of dopant complex 4 in $CH_3CN$ solution. The UV/vis absorption spectrum shows vibronic absorption transitions ranged 246 to 390 nm (ε=1.19 to $1.80 \times 10^{-4} dm^3 mol^{-1} cm^{-1}$) and moderately intense absorption bands from 478 to 520 nm (ε=1.20 to $1.06 \times 10^{-4} dm^3 mol^{-1} cm^{-1}$). The PL spectrum of dopant 4 in $CH_3CN$ shows a deep red emission at $\lambda_{max}$ 680 nm and 740 nm. PL quantum yield (Φ) of complex 4 is 0.001.

EXAMPLE 3

Example 3 illustrates a non-limiting method for preparing an OLED of the present invention. The electroluminescent devices were prepared on patterned indium-tin-oxide (ITO) glass with a sheet resistance of 20 Ω/square. The glass was cleaned sequentially in detergent solution, deionized water, ethanol and acetone. After the wet-cleaning process, the ITO glass was dried at 130° C. for 1 h and treated in UV ozone cleaner for 10 mins. In the practice of the present invention of this example, the device configuration is ITO/NPB (40 nm)/ CBP:X wt. % dopant complex as illustrated in formulae (I), or (II) (30 nm)/BCP (20 nm)/Alq$_3$ (30 nm)/LiF (0.5 nm)/Al (150 nm); all of the layers were grown sequentially by thermal deposition at a deposition rate of about 0.2 Å/sec or about 5 Å/sec under a vacuum of 1×10$^{-6}$ Torr.

The configuration of OLED in the present invention is schematically shown in FIG. 4. The device has multiple layers as shown. In particular, anode layer 410 preferably comprising indium-tin-oxide is deposited upon substrate layer 405. The substrate can be glass or other material through which the electroluminescence can traverse. Hole-transporting layer 415 comprising NPB is placed on top of layer 410. Emissive layer 420 employing CBP host and dopant complex is in contact with hole-transporting layer 415. A hole-blocking layer 425 containing BCP is deposited on the emissive layer 420. Adjacent to the hole-blocking layer 425, an electron-transporting layer 430, preferably Alq$_3$, is placed on it. A charge injection layer 435 comprising LiF is then deposited on the layer 430. On top of the layer 435, a cathode layer 440 is fabricated. Preferably, the thickness for NPB is 40 nm (hole-transporting layer 415) and the emissive layer 420 is about 30 nm thick; the hole-blocking layer 425 is 20 nm and electron-transporting layer 430 is 30 nm. The charge transport layer 435 is 0.5 nm thick and cathode layer 440 is preferably about 150 nm thick. The emissive area of device is 3×3 mm$^2$, which is defined by overlapping area between cathode and anode. Although not shown, glass substrate 405 need not be flat in all embodiments of the invention. In one embodiment, the glass substrate 405 is shaped, for instance, in a concave shape to focus the light generated in emissive layer 420, which provides even greater light intensity in a small region. In another embodiment, the glass substrate 405 is shaped, for instance, in a convex shape that spreads the generated light more diffusely.

EXAMPLE 4

Example 4 shows a red OLED A employing dopant complex 1 as dopant in a CBP host. The configuration of device A is ITO/NPB (40 nm)/CBP:4 wt. % dopant 1 (30 nm)/BCP (20 nm)/Alq$_3$ (30 nm)/LiF (0.5 nm)/Al (150 nm). At 4 wt. % dopant concentration, there was a red EL emission with a peak maximum at 620 nm corresponding to the 1931 Commission Internationale de L'Eclairage (CIE__1931) coordinates of x=0.62 and y=0.38 is obtained at 8V. The maximum external quantum efficiency ($\eta_{ext}$), luminous efficiency ($\eta_L$), power efficiency ($\eta_P$) and brightness of the device are 6.5%, 9.0 cd/A, 4.0 lm/W and 11 000 cd/m$^2$, respectively.

FIG. 5 shows EL spectra of the OLED A with 4.0 wt. % dopant 1 at different dopant concentrations under 8 V.

FIG. 6 shows EL spectra of the OLED A with 4.0 wt. % dopant 1 at different applied voltage.

FIG. 7 depicts V-I-B curve of the OLED A with 4.0 wt. % dopant 1.

FIG. 8 shows external quantum efficiency and luminous efficiency of the OLED A with 4.0 wt. % dopant 1.

Table 3 shows the EL performance of OLED A with 4.0 wt. % dopant 1 at different dopant concentrations.

TABLE 3

EL performance of OLED A with dopant 1 at different dopant concentrations

| Dopant (wt. %) | $V_{on}$ (V) | $B_{max}$ (cd/m$^2$) | $\eta_{ext, max}$ (%) | $\eta_{L, max}$ (cd/A) | $\eta_{P, max}$ (lm/W) |
|---|---|---|---|---|---|
| 0.5 | 3.5 | 8 030 | 4.1 | 7.1 | 3.1 |
| 1.0 | 3.4 | 9 700 | 5.5 | 7.4 | 3.5 |
| 2.0 | 3.5 | 10 050 | 5.9 | 8.6 | 3.8 |
| 4.0 | 3.2 | 11 000 | 6.5 | 9.0 | 4.0 |
| 6.0 | 3.3 | 9 500 | 5.6 | 7.5 | 3.3 |

EXAMPLE 5

Example 5 demonstrates an orange OLED B employing dopant complex 2 as dopant in a CBP host. The device configuration is ITO/NPB (40 nm)/CBP:5 wt. % dopant 2 (30 nm)/BCP (20 nm)/Alq$_3$ (30 nm)/LiF (0.5 nm)/Al (150 nm). At 5 wt. % dopant concentration, there was a orange EL emission with a peak maximum and a shoulder at 568 and 616 nm corresponding to the 1931 Commission Internationale de L'Eclairage (CIE__1931) coordinates of x=0.52 and y=0.48 is obtained at 8 V. The maximum external quantum efficiency ($\eta_{ext}$), luminous efficiency ($\eta_L$), power efficiency ($\eta_P$) and brightness of the device are 4.9%, 13.1 cd/A, 5.9 lm/W and 10120 cd/m$^2$, respectively.

FIG. 9 shows the EL spectra of OLED B with 5 wt. % dopant 2 at different dopant concentrations at 8 V.

FIG. 10 shows the EL spectra of OLEDs B with 5 wt. % dopant 2 at different applied voltages.

FIG. 11 shows the V-I-B curve of OLED B with 5 wt. % dopant 2.

FIG. 12 shows the external quantum efficiency and luminous efficiency of OLED B with 5.0 wt. % dopant 2.

Table 4 shows the EL performance of OLED B with dopant 2 at different dopant concentrations.

TABLE 4

The EL performance of OLED B with dopant 2 at different dopant concentrations

| Dopant (wt. %) | $V_{on}$ (V) | $B_{max}$ (cd/m$^2$) | $\eta_{ext, max}$ (%) | $\eta_{L, max}$ (cd/A) | $\eta_{P, max}$ (lm/W) |
|---|---|---|---|---|---|
| 1.0 | 3.3 | 8 200 | 3.9 | 10.2 | 4.8 |
| 3.0 | 3.2 | 9 150 | 4.4 | 11.9 | 5.3 |
| 5.0 | 2.9 | 10 120 | 4.9 | 13.1 | 5.9 |
| 8.0 | 3.0 | 9 250 | 4.2 | 11.6 | 5.1 |

The foregoing description of the preferred embodiments of the present invention has been presented for purposes of illustration and explanation. The various cited references and documents in the preceding description are all incorporated herein by reference in their entirety for all purposes. The description is not intended to be exhaustive nor to limit the invention to the precise form disclosed. As is expected, many modifications and variations will be apparent to those skilled in the art since the embodiments were chosen and described in order to explain the principles of the invention and its practical applications, thereby enabling others skilled in the art to understand the invention. For example, an advantage of the OLEDs of the present invention is that the color of the emitted light may be tuned during fabrication by changing the concentration of the dopant complex. In other embodiments, the color and/or intensity of the emission of the OLEDs of the present invention may be changed by the use of filters, as is known in the art. Various contemplated alternative embodiments and modifications that are suited to a particular use are within the scope of the invention. It is intended that the scope of the invention be defined by the accompanying claims and their equivalents.

What is claimed is:

1. A heterostructured organic light-emitting device comprising at least one emissive layer, at least one host material and at least one dopant complex in the emissive layer, wherein the dopant in the emissive layer is a compound having the following structure:

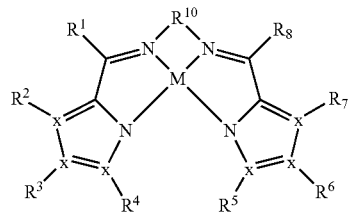

(I)

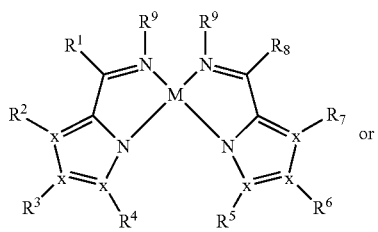 or (II)

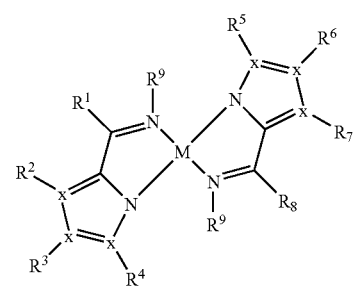

or a mixture of above compounds, wherein
M is a Ni, Pd or Pt;
each $R^1$-$R^8$ is independently —H, —OH, —NH$_2$, -halogen, —CN, —NO$_2$, —$R^{11}$, —OR$^{11}$, NHR$^{12}$, or —N(R$^{12}$)$_2$;
$R^{10}$ is —(C(R$^{13}$)$_2$)$_n$-,

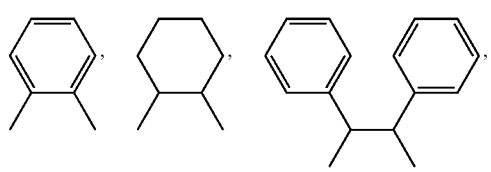

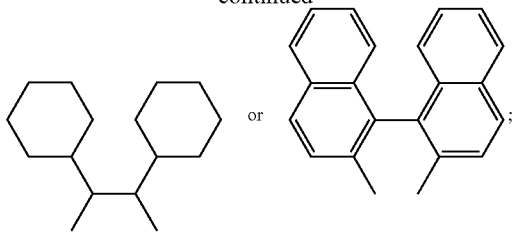

each $R^9$ is independently —H, —(C$_1$-C$_6$)alkyl, -phenyl, -naphthyl; -halogen, or —CN;
$R^{11}$ is —(C$_1$-C$_6$)alkyl, -phenyl, or -naphthyl, each of which is unsubstituted or substituted with one or more —(C$_1$-C$_6$)alkyl, -phenyl, or -naphthyl;
$R^{12}$ is as defined above for $R^{11}$; and
$R^{13}$ is as defined above for $R^1$;
each x is independently a carbon or nitrogen atom; and
n is an integer from 1 to 6.

2. The heterostructured organic light-emitting device of claim 1, wherein the dopant complex is geometrically in the cis-configuration.

3. The hererostructured organic light-emitting device of claim 1, wherein the dopant complex is geometrically in the trans-configuration.

4. The heterostructured organic light-emitting device of claim 1, wherein M is Pt.

5. The heterostructured organic light-emitting device of claim 4, wherein the dopant complex is one of the following complexes:

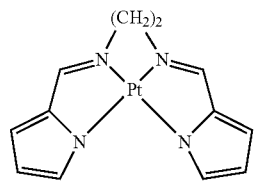

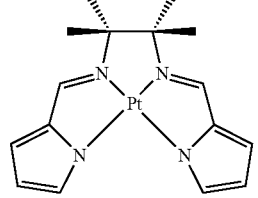

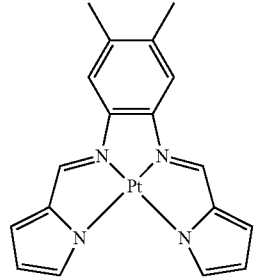

or a mixture thereof.

6. The heterostructured organic light-emitting device of claim 1, wherein the emissive layer comprises 0.5 to 8 weight % dopant complex based on the weight of host material.

7. The heterostructured organic light-emitting device of claim 6, wherein the dopant complex exhibits an electroluminescence of visible color.

8. The hererostructured organic light-emitting device of claim 6, wherein the dopant complex exhibits red, orange or yellow electroluminescence.

9. The heterostructured organic light-emitting device of claim 1, wherein the host material is beryllium bis(2-(2'-hydroxyphenyl)pyridine, 4,4'-bis(carbazol-9-yl)biphenyl (CBP), N,N'-diphenyl-N,N'-bis(1-naphthalene)benzidine (α-NPB), N,N'-diphenyl-N,N'-bis(2-naphthalene)benzidine (β-NPB), N,N'-bis(3-methylphenyl)-N,N'-bis(phenyl)benzidine (TPD), 4,4',4''-tris(N-3-methylphenyl-N-phenylamino)triphenylamine(m-TDATA) or tetrakis(diarylamino)-9,9'-spirobifluorene.

10. A method for preparing a heterostructured organic light emitting devices, which comprises providing an emissive layer including at least one host material and at least one dopant complex, wherein the dopant complex in emissive layer is a compound having the following structure:

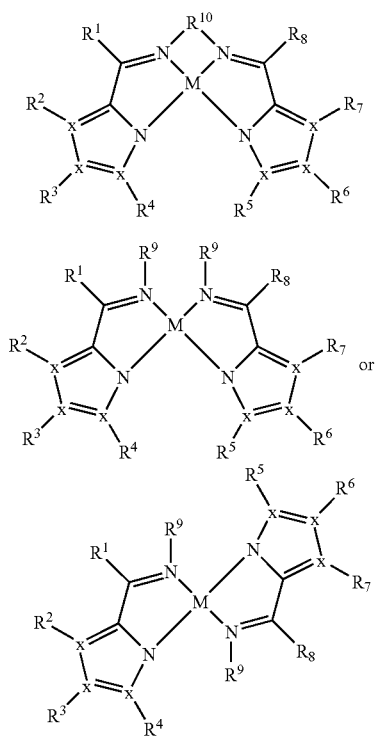

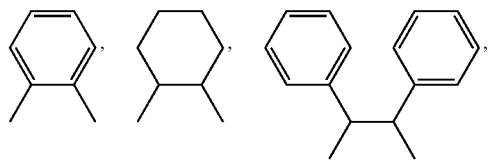

or a mixture of the above compounds, wherein
M is a Ni, Pd or Pt;
each $R^1$-$R^8$ is independently —H, —OH, —NH$_2$, -halogen, —CN, —NO$_2$, —$R^{11}$, —O$R^{11}$, NH$R^{12}$, or —N($R^{12}$)$_2$;
$R^{10}$ is —(C($R^{13}$)$_2$)$_n$-,

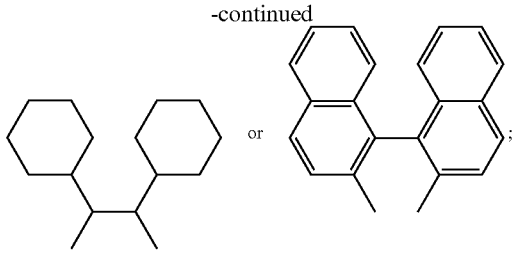

each $R^9$ is independently —H, —(C$_1$-C$_6$)alkyl, -phenyl, -naphthyl; -halogen, or —CN;

$R^{11}$ is —(C$_1$-C$_6$)alkyl, -phenyl, or -naphthyl, each of which is unsubstituted or substituted with one or more —(C$_1$-C$_6$)alkyl, -phenyl, or -naphthyl;

$R^{12}$ is as defined above for $R^{11}$; and $R^{13}$ is as defined above for $R^1$;

each x is independently a carbon or nitrogen atom; and n is an integer from 1 to 6.

11. The method of claim 10, wherein M is Pt.

12. The method of claim 10, wherein the dopant complex in emissive layer is selected from the following complexes:

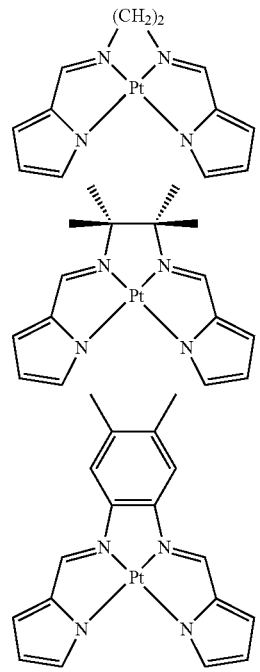

or a mixture of above complexes.

13. The method of claim 10, wherein the emissive layer comprises 0.5 to 8.0 weight % dopant complex based on weight of host material.

14. The method of claim 10, wherein the emissive layer comprises a dopant complex exhibits an electroluminescence of visible color.

15. The method of claim 10, wherein the emissive layer comprises a dopant complex which exhibits red, orange or yellow electroluminescence.

* * * * *